US008680833B2

(12) United States Patent
Wilson

(10) Patent No.: US 8,680,833 B2
(45) Date of Patent: Mar. 25, 2014

(54) MODULATED SUPPLY STAGE WITH FEEDBACK TO SWITCHED SUPPLY

(75) Inventor: Martin Paul Wilson, Cambridge (GB)

(73) Assignee: Nujira Limited (GB)

( * ) Notice: Subject to any disclaimer, the term of this patent is extended or adjusted under 35 U.S.C. 154(b) by 350 days.

(21) Appl. No.: 12/991,695

(22) PCT Filed: May 8, 2009

(86) PCT No.: PCT/EP2009/055611
§ 371 (c)(1),
(2), (4) Date: Jun. 13, 2011

(87) PCT Pub. No.: WO2009/135941
PCT Pub. Date: Nov. 12, 2009

(65) Prior Publication Data
US 2011/0234182 A1    Sep. 29, 2011

(30) Foreign Application Priority Data
May 9, 2008   (GB) .................................. 0808453.5

(51) Int. Cl.
*G05F 1/00*   (2006.01)
(52) U.S. Cl.
USPC .......................................... 323/285; 323/234
(58) Field of Classification Search
USPC ........................ 323/247, 259, 266, 234, 285
See application file for complete search history.

(56) References Cited

U.S. PATENT DOCUMENTS

| 4,329,657 A | 5/1982 | Kamiya |
| 4,346,349 A | 8/1982 | Yokoyama |
| 5,905,407 A | 5/1999 | Midya |
| 6,792,252 B2 * | 9/2004 | Kimball et al. ............ 455/127.3 |

(Continued)

FOREIGN PATENT DOCUMENTS

| GB | 2 398 648 A | 8/2004 |
| GB | 2 409 115 A | 6/2005 |

(Continued)

OTHER PUBLICATIONS

Robert Barrell, "British Search Report for International Application No. GB0808453.5 (relating to claims 34-40)", Nov. 26, 2008, Publisher: UK Intellectual Property Office, Published in: GB.

(Continued)

*Primary Examiner* — Adolf Berhane
*Assistant Examiner* — Yemane Mehari
(74) *Attorney, Agent, or Firm* — Kaplan Breyer Schwarz & Ottesen, LLP

(57) ABSTRACT

There is disclosed a voltage supply stage comprising: a selection means for selecting one of a plurality of power supply voltages in dependance on a reference signal representing a desired power supply voltage; a combining means for combining the selected power supply voltage with a correction signal to generate an adjusted power supply voltage; and an adjusting means adapted to generate the correction signal in dependence on the reference signal and the adjusted power supply voltage, wherein the selection means is arranged to select the one of the plurality of supply voltages further in dependence on a signal derived from one of the inputs to the combining means.

42 Claims, 6 Drawing Sheets

(56) References Cited

U.S. PATENT DOCUMENTS

| | | |
|---|---|---|
| 6,914,487 B1 | 7/2005 | Doyle et al. |
| 7,301,400 B1 | 11/2007 | Dening |
| 7,492,132 B2 * | 2/2009 | Kuroiwa et al. ............. 323/222 |
| 2003/0148792 A1 | 8/2003 | Kimball et al. |
| 2005/0064830 A1 | 3/2005 | Grigore |
| 2007/0210771 A1 | 9/2007 | Wilson et al. |
| 2008/0104432 A1 | 5/2008 | Vinayak et al. |
| 2008/0265996 A1 * | 10/2008 | Kim et al. .................... 330/291 |

FOREIGN PATENT DOCUMENTS

| | | |
|---|---|---|
| GB | 2 440 772 A | 2/2008 |
| WO | 2004112236 A1 | 12/2004 |
| WO | 2006021790 A1 | 3/2006 |
| WO | 2006111891 A1 | 10/2006 |
| WO | 2007080741 A1 | 7/2007 |
| WO | 2008072134 A1 | 6/2008 |

OTHER PUBLICATIONS

Robert Barrell, "British Search Report for International Application No. GB0808453.5", Sep. 11, 2008, Publisher: GB, Published in: GB.

Robert Barrell, "British Search Report for International Application No. GB0808453.5 (relating to claims 41-48)", Nov. 26, 2008, Publisher: UK Intellectual Property Office, Published in: GB.

Thomas Agerbaek, "International Search Report for International Application No. PCT/EP2009/055611", Oct. 20, 2009, Publisher: European Patent Office, Published in: EP.

"EP Application No. 09742159.8 Communication Pursuant to Rule 114(2) EPC Dec. 22, 2011", , Publisher: EPO, Published in: EP.

Sylvan, K., "GB Application No. GB0808453.5 Observations Under Section 21 Dec. 14, 2011", , Publisher: UK IPO, Published in: GB.

"International Preliminary Report on Patentability for International Application No. PCT/EP2009/055611", Nov. 18, 2010, Publisher: PCT The International Bureau of WIPO.

"Related Chinese Patent Application No. CN 2009-80126424.X", Mar. 18, 2013, Publisher: CIPO, Published in: CN.

* cited by examiner

MODULATED SUPPLY STAGE WITH FEEDBACK TO SWITCHED SUPPLY

BACKGROUND TO THE INVENTION

1. Field of the Invention

The present invention relates to a modulated supply stage, and particularly to such a stage in which a feedback loop is connected to provide an input to control selection of a low frequency switched supply. The feedback may be provided from the output of the low frequency switched supply stage or from the output of a high frequency correction stage.

2. Description of the Related Prior Art

It is known by those skilled in the art that envelope tracking (ET) and envelope elimination and restoration (EER) can give large improvements in efficiencies of power amplifier operation, particularly with signals such as orthogonal frequency-division multiplexing (OFDM) which have large crest factors. However, it is also known that the application of these techniques presents considerable difficulties due to the large powers and bandwidths involved. These difficulties become particularly formidable when applied to portable wireless terminals where the number of discrete components must be minimised and large dimensioned magnetics must be avoided.

An apparently simple solution would be to make the modulator a fast responding linear regulator. However, this would simply change power wasted in the power amplifier with that wasted in the linear regulator, resulting in no net gain in efficiency.

In order to gain some efficiency, some prior art implementations have been known to follow the switched mode supply with a low drop-out (LDO) fast responding linear regulator. This removes the errors inherent in the switched mode operation. However a problem arises in that there must be sufficient range in the linear regulator to allow for the peaks in the switched mode error, which can be considerably larger than the root mean square (RMS) error. This results in a large standing dissipation in the LDO.

A significant improvement on this is provided by techniques disclosed in GB2398648. This implementation is shown in FIG. 1. FIG. 1 shows a diagram of a typical switched mode power supply used as an efficient power conversion means. It must be noted that this is given as an example; the invention is not restricted to topologies of this type.

A coarse DC-DC switched supply 102 provides an approximation to the required waveform, provided as a reference waveform on input line 118, after filtering with filter network 104. The filter comprises an inductor 106 for storage of magnetic energy, and a capacitor 108 for storage of electric energy. A transformer 110 is used which can give true summation, e.g. signals can be added and subtracted, so the mean correction from a correction amplifier 114 can be set to zero, eliminating large standing dissipation. The output of the transformer provides an output to a load 112. The output of the transformer 110 is fedback to provide an input to the correction amplifier 114, which receives as a further input a reference signal on line 116 (which may be the same as, or derived from the same source as, the reference signal on line 118). The transformer combines the switched supply voltage with the output of the correction amplifier to provide a corrected output voltage.

A potential problem with the architecture of FIG. 1 is that the transformer 110 has to have a high self-inductance to prevent shunting of the correction current through the unwanted inductance of the transformer. This means that large ferrite cores must typically be used. Whilst this is acceptable for wireless infrastructure implementations, this presents particular difficulties for portable handset implementations or any implementation where size restrictions may apply.

The supply stage of FIG. 1 is capable of very efficient operation, but the circuit can only be switched between two levels: intermediate levels can only be obtained by the filtering action of the energy storage elements 106 and 108. For low frequency outputs (frequencies much less than the switching frequencies), this arrangement will be able to perform tracking, but the circuit may provide poor tracking at high frequency. There will also be substantial breakthrough of switching related products at high frequencies. When the said power conversion circuit is used as a modulator, the energy storage elements form a parallel resonant tank which will present a high impedance to the load at some frequencies.

The effect of this can be seen in FIG. 2. The reaction of the energy storage elements to the rapidly changing current demand produces a waveform 204 at the power amplifier. This shows severe mistracking when compared with the wanted waveform 202. Also, the high output impedance may result in instability of the load.

Examples of prior art switched mode modulators can be found in U.S. Pat. Nos. 5,905,407, 6,054,914, 6,198,374, 6,300,826, 6,583,664, 6,661,210, 6,661,217, 6,710,646, 6,792,252, and in US Patent application No. 2002/0008574.

It is an aim of the invention to provide an improved modulated power supply stage.

SUMMARY OF THE INVENTION

In one aspect the invention provides a voltage supply stage comprising: a selection means for selecting one of a plurality of power supply voltages in dependence on a reference signal representing a desired power supply voltage; a combining means for combining the selected power supply voltage with a correction signal to generate an adjusted power supply voltage; and an adjusting means adapted to generate the correction signal in dependence on the reference signal and the adjusted power supply voltage, wherein the selection means is arranged to select the one of the plurality of supply voltages further in dependence on a signal derived from one of the inputs to the combining means.

The inputs to the combining means are the signals to be combined: the selected power supply voltage and the correction signal. The selected power supply voltage is the output of the selection means, which is preferably a switched voltage supply. The correction signal is the output of the adjustment means.

The signal derived from one of the inputs to the combining means may be the output of the selection means.

The signal derived from one of the inputs to the combining means may be the output of the adjusting means.

A feedback control stage may provide the signal derived from one of the inputs to the combining means to the selection means. The feedback control stage may be adapted to receive as a first input the reference signal and as a second input one of the inputs to the combining means, and further adapted to adjust the reference signal in dependence on the one of the inputs to the combining means to provide an adjusted reference signal for the selection means.

In an embodiment the feedback control stage may comprise: a subtractor for subtracting the output of the selection means from the reference signal; a proportional-integral, PI, controller for receiving the subtracted signal and generating a modified output, and a summer for adding the modified output of the PI controller to the reference signal, to form the output of the feedback control stage being the adjusted reference signal.

In an alternate embodiment the feedback control stage may comprise: a proportional-integral, PI, controller for receiving the output of the adjusting means and generating a modified output, and a summer for adding the modified output of the PI controller to the reference signal, to form the output of the feedback control stage being the adjusted reference signal.

The combining means preferably comprises an inductor, and the adjustment means preferably comprises a voltage-to-current converter, wherein a current representing the correction signal is injected at the second terminal of the inductor to adjust the current flowing in the inductor provided by the selected power supply voltage, a thus adjusted current flowing in a load connected to the second terminal of the inductor to thereby develop the adjusted supply voltage across said load.

The voltage supply stage preferably comprises a reference adjustment stage for adjusting the reference signal to provide a modified reference signal. The selection means may be adapted to select in dependence on the modified reference signal. The feedback control means may be adapted to provide the signal derive from one of the inputs to the combining means in dependence on the modified reference signal.

The reference adjustment stage may comprise a means for adjusting the amplitude of the reference signal in dependence upon a difference between the amplitude of the reference signal and the amplitude of the selected supply voltage. The means for adjusting the amplitude of the reference signal may include: a correlator for determining the amplitude error between the reference signal and the selected supply voltage; and an amplitude adjustment block for modifying the reference signal in dependence on said error. The reference adjustment stage may comprise a means for controlling a current flow in the combining means to maximize current slow in the combining means and thereby minimize current flow in the adjustment means. The means for controlling the current flow may include: a correlator for determining the current flow in the inductor and for providing a control signal to modify coefficients of a differentiator in dependence thereon, the differentiator being arranged to receive the reference signal and generate a differentiated version thereof. The differentiator may be arranged to receive as an input the amplitude adjusted reference signal generate a differentiated amplitude adjusted reference signal, the reference adjustment stage further comprising a summer for summing the amplitude adjusted reference signal with the differentiated amplitude adjusted reference signal to form the modified reference signal.

A tracking modulated power supply stage for a mobile wireless device preferably includes a voltage supply stage as defined.

In this aspect the invention also provide a method for generating a supply voltage comprising: selecting one of a plurality of power supply voltages in dependence on a reference signal representing a desired power supply voltage; combining the selected power supply voltage with a correction signal to generate an adjusted power supply voltage; generating the correction signal in dependence on the reference signal and the adjusted power supply voltage; and providing as a feedback signal one of the input signals to the combining step, wherein the selecting step is further arranged to select the one of the plurality of supply voltages in dependence on the feedback signal.

The providing step may provide the output of the selection means as the feedback signal. The providing step may provide the output of the adjusting means as the feedback signal.

The method may further comprise the step of controlling the feedback signal for providing the signal derived from one of the inputs to the combining means to the selection means.

The step of controlling the feedback may comprise receiving as a first input the reference signal and as a second input one of the inputs to the combining step, and adjusting the reference signal in dependence on the one of the inputs to the combining step to provide an adjusted reference signal for the selecting step.

The step of controlling the feedback may comprise: subtracting the output of the selection means from the reference signal; receiving the subtracted signal and generating a proportional-integral, PI, modified output, and adding the modified output to the reference signal, to form the adjusted reference signal.

The step of controlling the feedback may comprise: receiving the output of the adjusting means and generating a proportional-integral, PI, modified output, and adding the modified output to the reference signal, to form the adjusted reference signal.

The combining means may comprise an inductor, and the adjustment means may comprise a voltage-to-current converter, the method further may comprise injecting a current representing the correction signal at the second terminal of the inductor to adjust the current flowing in the inductor provided by the selected power supply voltage, a thus adjusted current flowing in a load connected to the second terminal of the inductor to thereby develop the adjusted supply voltage across said load.

The method may further comprise the step of adjusting the reference signal to provide a modified reference signal.

The selecting step may be adapted to select in dependence on the modified reference signal.

The feedback control step may be adapted to provide the signal derived from one of the inputs to the combining step in dependence on the modified reference signal.

The step of adjusting may include adjusting the amplitude of the reference signal in dependence upon a difference between the amplitude of the reference signal and the amplitude of the selected supply voltage.

The step of adjusting the amplitude of the reference signal may include: determining the amplitude error between the reference signal and the selected supply voltage; and modifying the reference signal in dependence on said error.

The step of adjusting may comprise controlling a current flow in the combining means to maximize current flow in the combining means and thereby minimize current flow in the adjustment means.

The step of controlling the current flow may include: determining the current flow in the inductor and for providing a control signal to modify coefficients of a differentiator in dependence thereon, the differentiator being arranged to receive the reference signal and generate a differentiated version thereof.

The method may further comprise the steps of: receiving at the differentiator as an input the amplitude adjusted reference signal; and generating a differentiated amplitude adjusted reference signal, the adjustment step further comprising summing the amplitude adjusted reference signal with the differentiated amplitude adjusted reference signal to form the modified reference signal.

In another aspect the invention provides a combiner for combining a first voltage signal with a second voltage signal to provide a combined voltage signal, comprising: an inductor having a first terminal connected to the first voltage signal; a load connected to the second voltage terminal; and a conversion means for receiving at an input the second voltage signal and generating at an output a current representing the second voltage signal, the output of the conversion means being connected to the second terminal of the inductor, wherein a current is generated in the load representing the combined first and second voltages, the combined voltage signal thus being developed across the load.

The combiner may further comprise a capacitor connected at the second terminal of the inductor, wherein in combination the inductor and the capacitor form an L-C filter for the combined signal.

The conversion means may be a voltage-to-current converter.

The load may be a power amplifier, and the combined voltage is a supply voltage for the power amplifier.

A modulated voltage supply may comprise a combiner as defined, and may further comprise: a selection means for selecting one of a plurality of power supply voltages in dependence on a reference signal, the selected supply being the first voltage signal, the conversion means being an adjusting means for generating a correction signal comprising the second voltage signal in dependence on the reference signal and the combined voltage signal.

In this aspect the invention also provides a method for combining a first voltage signal with a second voltage signal to provide a combined voltage signal, comprising: connected to the first voltage signal to a first terminal of an inductor; connecting a load to the second terminal of the inductor; converting the second voltage signal into a current representing the second voltage signal; providing the current representing the second voltage signal at the second terminal of the inductor, wherein a current is generated in the load representing the combined first and second voltages, the combined voltage signal thus being developed across the load.

The step of providing the current representing the second voltage signal at the second terminal of the inductor may comprise injecting current into the second terminal of the inductor.

In a further aspect the invention provides a voltage supply stage comprising: a selection means for selecting one of a plurality of power supply voltages in dependence on a reference signal representing a desired power supply voltage; a combining means for combining the selected power supply voltage with a correction signal to generate an adjusted power supply voltage; a correction means adapted to generate the correction signal in dependence on the reference signal and the adjusted power supply voltage; an adjustment means for adjusting the amplitude of the reference signal in dependence on a difference between the amplitude of the reference signal and the amplitude of the selected supply voltage; and differentiation means for controlling the current in the combining means to maximize the current flowing in the combining means and thereby minimize the current required to flow in the correction means.

The adjustment means may include: a correlator for determining an amplitude error between the reference signal and the selected supply voltage; and an amplitude adjustment block for modifying the reference signal in dependence on said error.

The means for controlling the current in the combining means to maximize the current flowing in the combining means and thereby minimize the current flowing in the correction means may include a correlator for determining the current flow in the inductor and for modifying coefficients of a differentiator in dependence thereon.

The amplitude adjustment block may receive the reference signal and generates the amplitude adjusted reference signal, the differentiator receives the amplitude adjusted reference signal and generates a differentiated version thereof at its output, and a summer sums the amplitude adjusted reference signal and the modified differentiated reference signal to provide the reference signal for use by the modulated power supply stage.

In this further aspect the invention also provides a method for a generating a modulated supply voltage, comprising: selecting one of a plurality of power supply voltages in dependence on a reference signal representing a desired power supply voltage; combining the selected power supply voltage with a correction signal to generate an adjusted power supply voltage; generating the correction signal in dependence on the reference signal and the adjusted power supply voltage; adjusting the amplitude of the reference signal in dependence on a difference between the amplitude of the reference signal and the amplitude of the selected supply voltage; and controlling the current in the combining means by differentiation to maximize the current flowing in the combining means and thereby minimize the current required to flow in the correction means.

The adjustment step may include: determining an amplitude error between the reference signal and the selected supply voltage; and modifying the reference signal in dependence on said error.

The controlling the current in the combining means to maximize the current flowing in the combining means and thereby minimize the current flowing in the correction means may include determining the current flow in the inductor and modifying coefficients of a differentiator in dependence thereon.

The amplitude adjustment block may receive the reference signal and generate the amplitude adjusted reference signal, the differentiator may receives the amplitude adjusted reference signal and generates a differentiated version thereof at its output, and a summer sums the amplitude adjusted reference signal and the modified differentiated reference signal to provide the reference signal for use by the modulated power supply stage.

All aspects and feature of the invention as defined or as discussed in the following description may be implemented individually or in any combination.

BRIEF DESCRIPTION OF THE FIGURES

The invention will now be described by way of example with reference to the accompanying figures in which.

DESCRIPTION OF PREFERRED EMBODIMENTS

Figure 1:
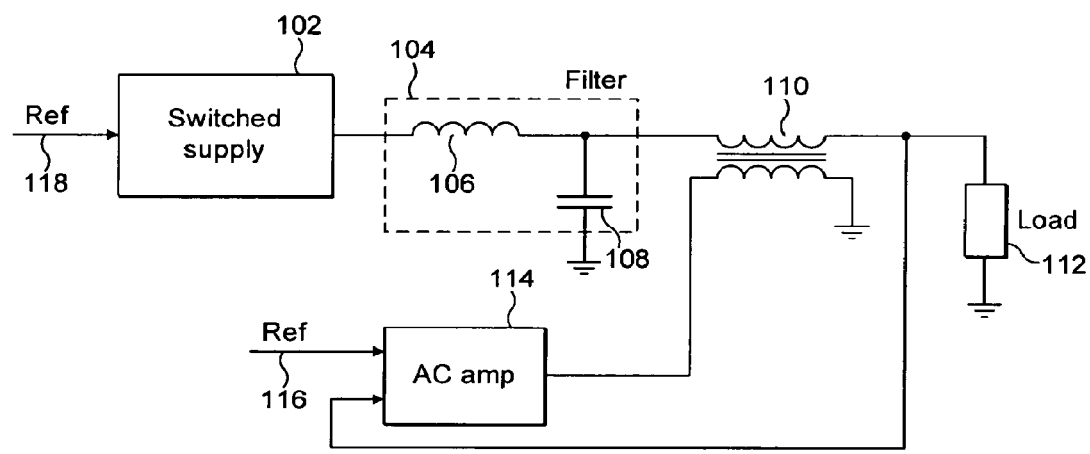
FIG. 1 illustrates a modulated power supply stage including a low frequency switched supply and a high frequency error correction in accordance with the prior art.
Figure 2:
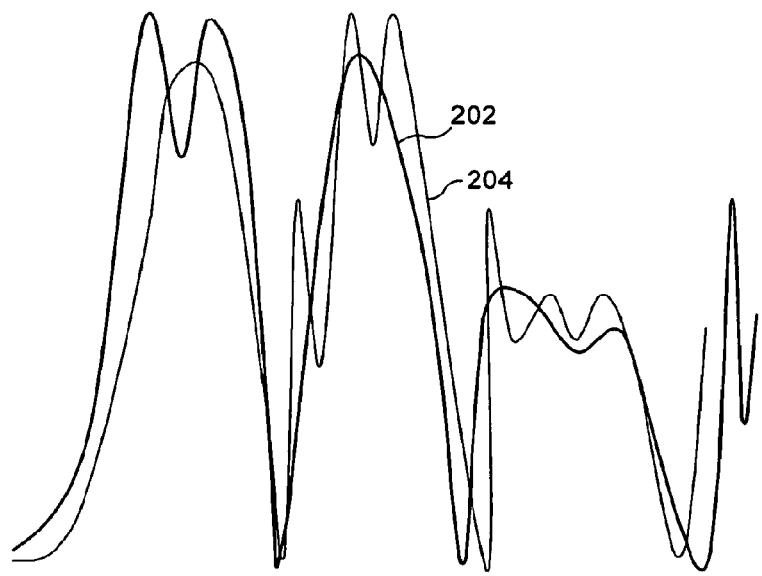
FIG. 2 illustrates a problem associated with a prior art arrangement such as FIG. 1.

The invention will now be described by way of example with reference to its application in various embodiments. One skilled in the art will appreciate that the invention is not limited in its scope to the specifics of implementation details of any particular embodiment.

The broad principle in accordance with the invention is to provide an additional feedback path. The feedback path provides an input to the switched supply.

The provision of the feedback path is in accordance with one of two broad embodiments. In a first broad embodiment the feedback path originates from the output of the switched supply, i.e. the output of a coarse path. In a second broad embodiment the feedback path originates from the output of the correction path. Thus the switched supply stage is provided an input derived from an input to the combiner stage for combining the switched supply with the correction signal. This feedback reduces errors at low frequencies, and allows the bandwidth of the combiner stage to be reduced.

A first arrangement for the implementation of the first broad embodiment is now described with reference to FIG. 3. Like reference numerals are used in the following figures where any element corresponds to an element shown in another figure.

Figure 3:
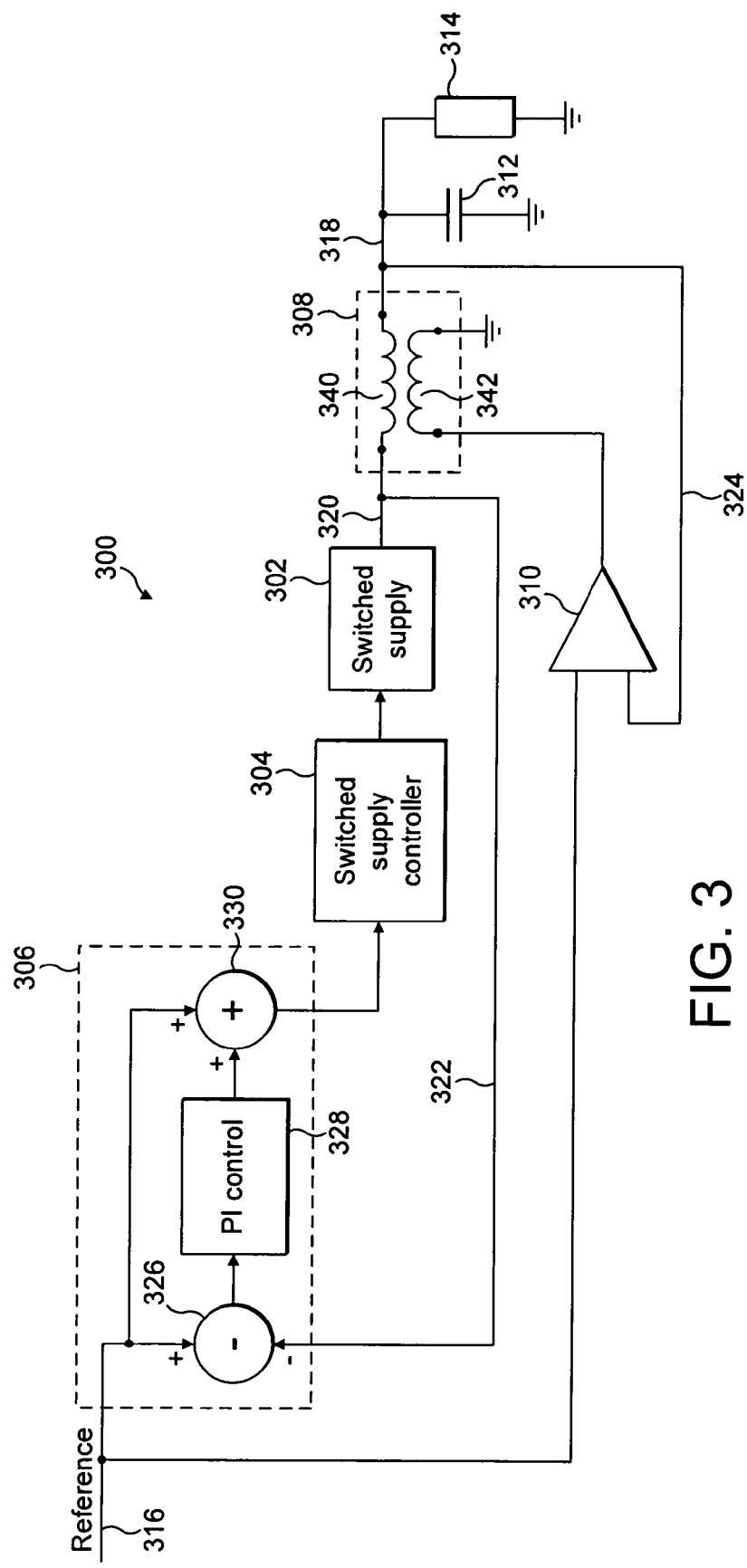
FIG. 3 illustrates an improvement in a modulated power supply stage in accordance with a first exemplary embodiment of the invention.

The modulated supply stage of FIG. 3, generally denoted by reference numeral 300, comprises a switched supply stage 302, a switched supply controller 304, a correction amplifier 310, a combiner stage 308, a feedback control stage 306, a capacitor 312 and a load 314.

Modulated supply stage 300 of FIG. 3 provides a modulated supply on an output line 318 to the load 314 in dependence on a reference signal provided on input line 316. The load 314 may be a power amplifier.

The switched supply controller 304 receives an input signal from the feedback control stage 306. In dependence upon the signal from the feedback control stage 306, the switched supply controller 304 controls the switched supply 302 to provide a switched supply output on line 320. The switched supply output on line 320 provides a first input to the combiner stage 308. The feedback control stage 306 receives two inputs: a first input is provided on line 322 from the output of the switched supply stage 302 on line 320, and a second input is provided by the reference signal on the input line 316. The feedback control stage 306 operates to adjust the received reference signal in dependence upon the feedback signal to provide a modified input to the switched supply controller 304.

A second input to the combiner stage 308 is provided by the output of the correction amplifier 310. The correction amplifier 310 receives as a first input the reference signal on line 316, and receives as a second input a feedback signal on line 324 comprising the output of the combiner stage 308 on line 318.

An optional capacitor 312 is connected between the output line 318 and ground.

In the example arrangement of FIG. 3, in accordance with the first embodiment, the combiner stage 308 is implemented as a transformer. The transformer has a first winding 340 and a second winding 342. A first tap of the first winding 340 is connected to the output of the switched supply stage 302 on line 320. A second tap of the first winding 340 provides the output signal on line 318. A first tap of the second winding 342 is connected to receive the output of the correction amplifier 310. A second tap of the second winding 342 is connected to ground. In this way, the transformer combines the output of the switched supply with the output of the correction amplifier to generate a corrected switched supply at its output.

The feedback control stage 306 operates to utilise the feedback on line 322 from the output of the switched supply to provide an improved version of the reference signal on line 316 to the input of the switched supply controller 304. The feedback control stage 306 includes a subtractor 326, a summer 330, and a PI control block 328. The subtractor receives the reference signal on line 316 as one input and the feedback signal on 322 as another input. The feedback signal on line 322 is subtracted from the reference signal on line 316 to provide an input to the PI control block 328. The implementation of a PI (proportional-interval) controller is well-known in the art. The output of the PI control block 328 forms a first input to the summer 330, the second input to the summer 330 being provided by the reference signal on line 316. The summer adds the output of the PI control block 328 to the reference signal 316, to generate a modified reference signal for the switched supply controller 304 as the output of the feedback control stage 306. The summer 330 adds a feedforward element to the feedback control, which is needed as large amplitude signals are being handled.

The feedback control stage 306 operates by sensing differences in level using subtracting means 326. The output level from the subtractor 326 is sensed by the PI control block 328 and used to provide a slow adjustment trim to the input level to the switched supply controller 304 so that both levels are as close as possible.

The feedback provided in the switched supply stage path on line 322 removes low frequency errors in the switched supply output on line 320 such that the combiner stage 308 may be implemented as a smaller device than would otherwise be possible.

The switched supply controller 304 controls the switched supply to select the appropriate supply voltage in accordance with techniques known in the art. The switched supply controller controls the switched supply 302 in accordance with the signal on its input line, which in the illustrated arrangement is provided by the output of the feedback control stage 306.

In a modified arrangement, the combiner stage 308 is implemented as an inductor rather than as a transformer. This modified implementation is shown in FIG. 4.

Figure 4:
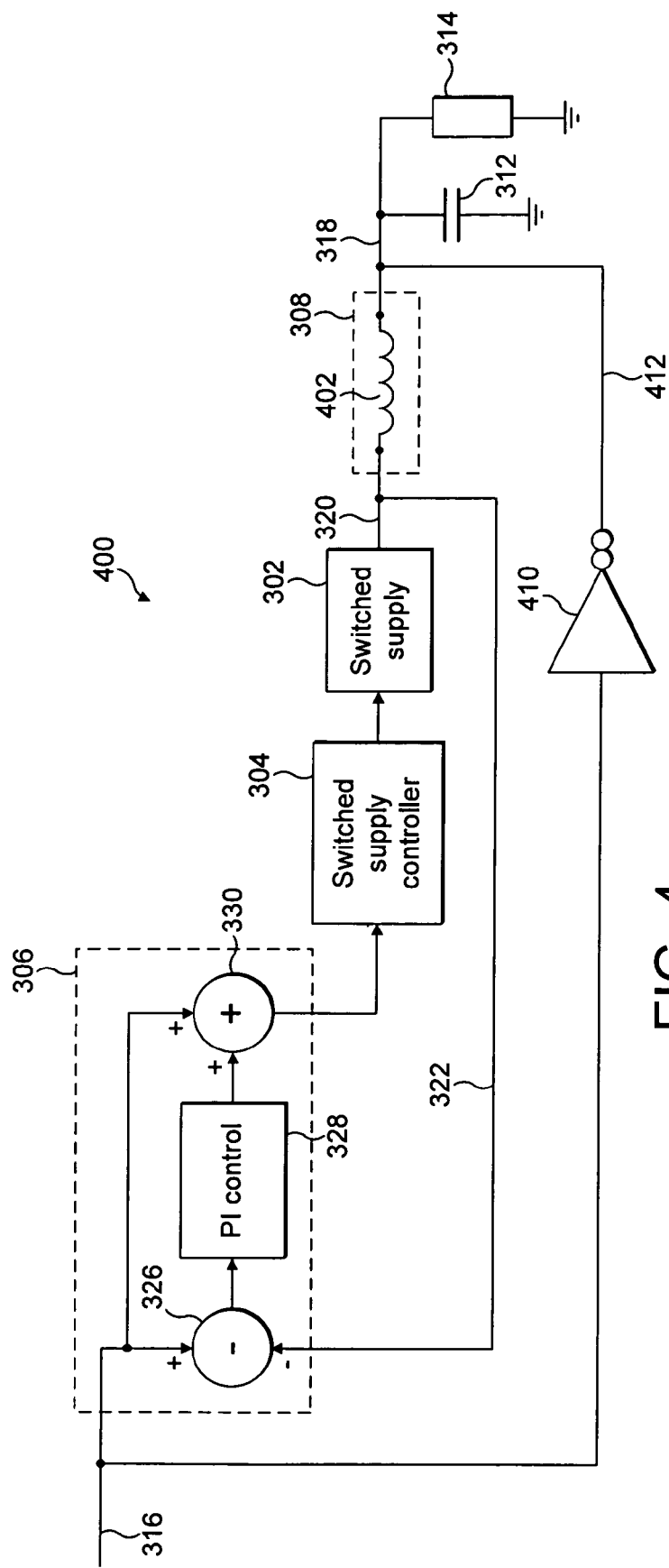
FIG. 4 illustrates a modification to the preferred implementation of the first embodiment.

As illustrated in FIG. 4, the combiner stage 308 is provided with an inductor 402 having a first terminal connected to the output line 320 of a switched supply stage 302. A second terminal of the inductor 402 provides the output signal on line 318.

Implementing the combiner stage 308 as an inductor, an additional modification is provided to achieve the combining function. The correction amplifier 310 of FIG. 3 is replaced by the correction amplifier 410 of FIG. 4. The correction amplifier 410 provides a current output on line 412, which injects current at the terminal of the inductor 402 which is connected to the output line 318. This provides the function of combining the correction signal with the switched supply signal to obtain a modified modulated supply voltage on line 318.

The inductor 402 of the exemplary arrangement of FIG. 4 has two functions. Firstly, the inductor combines the switched supply signal with the correction (or adjustment) signal. Secondly, the inductor 402 may combine with the capacitor 312 to provide the L-C filter provided by inductor 106 and capacitor 108 in FIG. 1.

In comparison to the architecture of GB2398648, the magnetising or self inductance of the inductor 402 is used as part of the circuit function, rather than being an unwanted but necessary additional means, as in the transformer arrangement of FIG. 3. Where the L-C arrangement as shown in FIG. 1 is provided, the inductor 106 may implement the inductor 402, and the capacitor 108 may implement the capacitor 312. Thus the combiner is implemented using existing circuitry. This suggests that the bandwidth requirement of the output combining circuit is much reduced.

Another significant different between the architecture of FIG. 3 and that of FIG. 4 is that most of the output current is shunted through the inductor 402 by the switched supply stage rather than being provided by the correction amplifier.

In general, with reference to FIG. 4, the switched supply 302 switches between a set of voltages under the control of the switched supply control block 304, to select the switched supply corresponding to the reference signal voltage on line 316. The correction amplifier 410 provides an adjustment or correction signal as a current, which is added to the current flowing in the output at the inductor 402 on line 318 representing the switched supply voltage. The adjusted current on line 318 develops an adjusted supply voltage for the load 314.

The additional elements of FIG. 4 are provided as preferred elements to enhance the operation of the arrangement of FIG. 3. The implementation of the combiner stage 308 as an inductor, with a current injecting correction amplifier, is not dependent on the feedback provided on line 322. This arrangement may advantageously be implemented independent of the provision of feedback for the switched supply stage.

Figure 5:
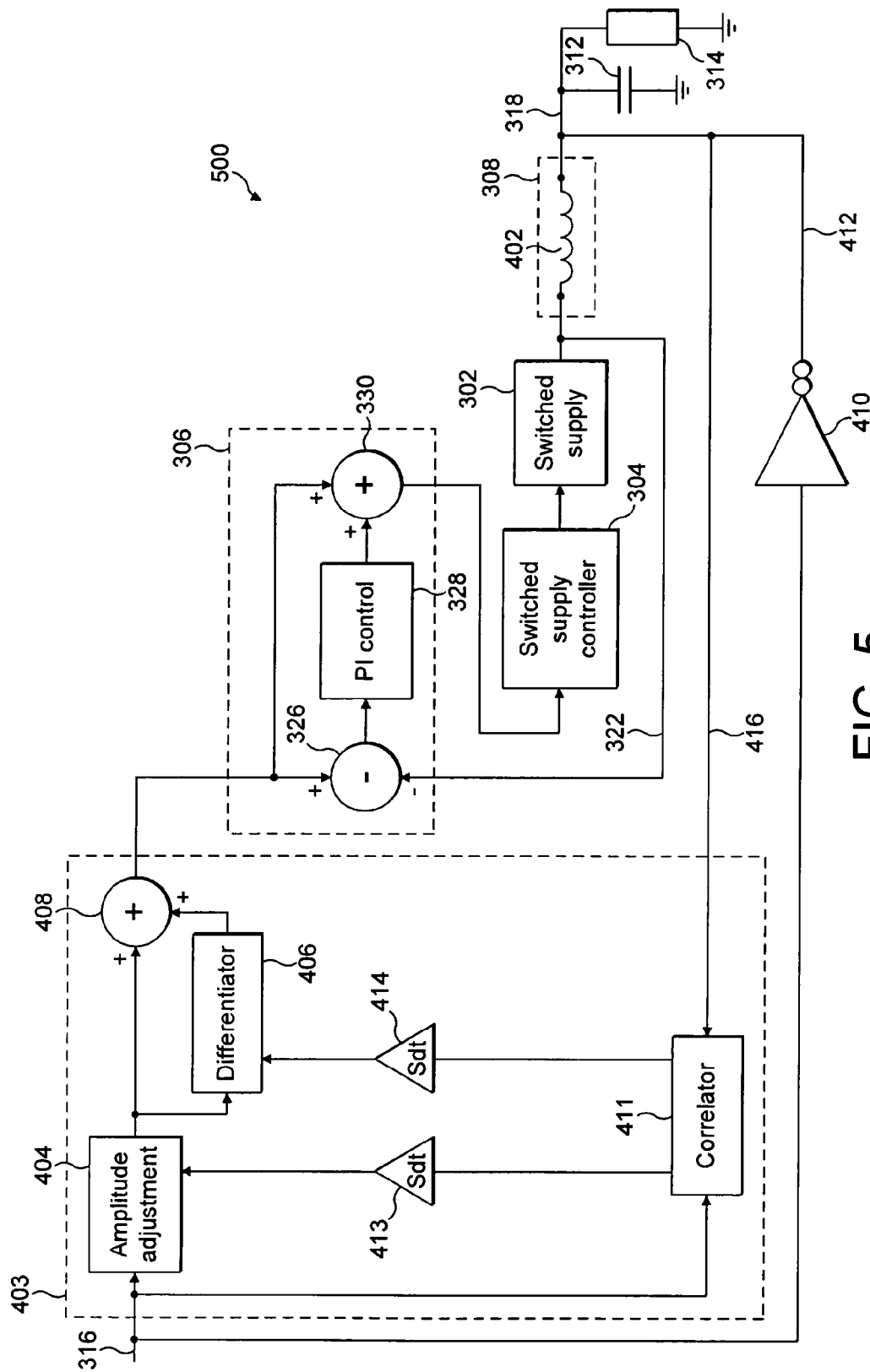
FIG. 5 illustrates a further modification to the preferred implementation of the first embodiment.

With reference to FIG. 5, there is illustrated a still further modification in an exemplary arrangement. With reference to FIG. 5, the modulated supply stage 500 illustrated therein is additionally provided with a reference adjustment stage 403.

The reference adjustment stage is adapted to receive as an input the reference signal on line 316. The reference adjustment stage 403 additionally receives a further input being a feedback signal on line 416 derived from the output of the correction amplifier 410 on line 412. The reference adjustment stage 403 generates an output which forms an input to the feedback control stage 306. In the arrangement of FIG. 5, rather than the feedback control stage 306 receiving the reference signal on line 316 as a direct input, the feedback control stage 306 receives a modified version of such reference signal provided as the output of the reference adjustment stage 402.

The reference adjustment stage 403 includes an amplitude adjustment block 404, a differentiator block 406, a summer 408, a correlator 411, and two integrators 413 and 414.

The correlator 411 receives as a first input the reference signal on line 316, and as a second input the output of the correction amplifier 410 on line 416. The correlator generates two outputs. The first output is provided to the amplitude adjustment block 403 via an integrator 413. A second output is provided to the differentiator block 406 via an integrator 414. The amplitude adjustment block receives as an input the reference signal on line 316, in addition to the integrated first output of the correlator 411. The differentiator block 406 receives the output of the amplitude adjustment block 403 as a first input, and the second integrated output of the correlator 411 as a second input. The summer 408 receives as a first input the output of the amplitude adjustment block 401, and as a second input the output of the differentiator block 406. The output of the summer 408 forms the output of the reference adjustment stage 403, providing the input to the feedback control stage 306.

The correlator 411 correlates the reference signal current on line 316 with the current provided by the correction amplifier 410 on line 416. The correlator 411 provides a positive output when both input signals correlate, and a negative output when both input signals are in anti-correlation. Two outputs are generated from the correlator 411 depending on the selection of differently shaped filter responses present at the correlator input. Thus the correlator is controlled, by means not shown, to apply its input signals to one of two sets of filters.

The differentiator 406 is controlled by the correlator when the filter response of the correlator input is selected to have a bandpass response. The amplitude adjustment block 404 is controlled by the correlator when the filter response of the correlator input is selected to have a low pass response. The correlator thus generates two outputs, which outputs form inputs to the integrators 413 and 414.

The integrator 414 integrates up the correlator output allowing it to steer the differentiator coefficients of the differentiator 406 in a controlled manner.

The reference adjustment stage 403 provides a two-fold functionality. A first functionality is provided by the differentiator 406, and a second functionality is provided by the amplitude adjustment block 404.

In general, the differentiator 406 operates to maximise the current flowing through the inductor 402. This minimises the current required to be delivered by the correction amplifier 410, as discussed in further detail below.

In general, the amplitude adjustment block 404 operates to minimise the requirements of the correction amplifier 410 to provide the amplitude corrections, so that the correction amplifier can work less-hard, as discussed in further detail below.

The voltage at the first terminal of the inductor 402 is the output of switched supply 302 which may be approximated as $ax_1 + b \cdot dx/dt$ where $a_1$ is the wanted signal output of the modulator, $dx/dt$ represents the time-derivative correction signal, and b is the amplitude of the time-derivative correction signal.

The voltage at the second terminal of the inductor is the voltage at the first terminal corrected by the action of the correction amplifier such that it is maintained as closely as possible to a voltage signal which may be represented by $ax_2$ where $ax_2$ is the wanted modulator output.

The differentiator 406 operates to control the amplitude component b of the voltage signal delivered to the load. The correlator 411 provides the differentiator 406 with information as to the current flowing in the inductor 402. Based on that current information, the coefficients of the differentiator are adjusted to ensure the voltage level b is the correct level. The differentiation in block 406 is then changed. The differentiator thus improves the signal to be nearer the voltage that is wanted.

Without the differentiator 406, there is a dc current flow (but no ac current flow) through the inductor 402 due to the switched supply feedback path. The differentiator 406 is provided to ensure most of the current flows, not just the dc current flow, through the inductor 402.

The current correlator 411 multiplies the AC current provided by the correction amplifier 410 with the AC component of the reference signal on line 316. If the time derivative of the reference signal is too low, the correction amplifier current correlates. If the derivative term is too high, there is anti-correlation between the two signals. This can be used to adjust the link between the measured load current and the derivative terms. The second order terms will not need adjusting.

The implementation of a differentiator such as differentiator 406, and the adaptation of differentiator coefficients, is known to one skilled in the art.

The operation of the differentiator 406, to obtain performance improvements, can be further understood as follows.

The switched supply 302 is used as the primary tracking element, with the correction amplifier 410 applying a fine adjustment or correction. The switched supply 302 runs closed loop for improved tracking based on the feedback path 322. There will still be some residual errors present in the output of the switched supply. The correction amplifier provides another closed loop that removes the residual errors present in the output of the switching supply. The correction amplifier can remove high frequency errors, but low frequency correction is impaired by the shunting effect of the self inductance of the inductor 402. However, the switched supply loop has higher loop gain at low frequencies, so correction can be curtailed at lower frequencies.

The reference adjustment stage 403 addresses a problem which arises when both feedback loops force both sides of the inductor 402 to be equal. This would force the voltage across the inductor 402 to be zero. As a result of this, the correction amplifier 410 would be required to source the entire AC part of the current in the inductor 402. In order to force AC current to flow through the inductor 402, the voltage across the inductor 402 must be equal to the inductance multiplied by the time derivative of the current flowing through the inductor 402. The current through the inductor 402 is the current through the load 314, and by definition the voltage output of an envelope tracking modulator must follow this current. Therefore, if the input to the switched supply 302 follows the time derivative term as well as the modulation signal, then it is possible for the switched supply 302 to supply most of the AC current besides the DC, thus reducing the power needed to be delivered by the correction amplifier 410.

The capacitor 312 connected at the output results in a component of voltage across the inductor 402 being equal on the second derivative of the applied modulation voltage. This means that ideally the signal applied to the switched supply 302 should have first and second derivative terms. The second derivative terms are fixed by the inductor and capacitor values used, but the first derivative is also a function of the current drawn by the load 314. Therefore some measure of load current is required, and the derivative terms are linked to this load current.

The link between the load current and this derivative term is established by means of the correlator 411, as discussed above.

The amplitude adjustment block 404 operates to ensure that the amplitude of the dc signal across the inductor 402 is zero, i.e. the amplitude at the two terminals of the inductor is zero. The amplitude adjustment block 404 thus operates to attempt to make $a_1$ equal to $a_2$. If a1 and a2 are made equal, then the voltage signal developed at the second terminal of the inductor, for delivery to the load, is provided by the component b·dx/dt only.

If such an objective is achieved, then the correction amplifier does not need to provide the amplitude correction, and the workload of the correction amplifier is reduced.

The reference adjustment stage 403 is provided to achieve these performance objectives.

The potential amplitude imbalance at the terminals of the inductor is as a result of a potential amplitude imbalance between the output from the switched supply 302 and the reference signal presented to the input of the correction amplifier 410 on line 316. Such amplitude imbalance results in a large current flowing in the inductor 402, particularly at low frequencies. The amplitude adjustment block 404, forcing the input to the feedback control stage 306 to be equal to the switched output on line 302 at low frequencies, addresses this problem, as consequentially the voltage developed at the terminals of the inductors is then matched.

The amplitude adjustment block 404 adjusts the amplitude of the reference signal on line 316 in dependence on a correlation signal, which represents an amplitude error. The correlation signal is provided from the correlator 411 via the integrator 413. The thus amplitude adjusted reference signal is provided by the amplitude adjustment clock 404 as an input to the summer 408 and as an input to the differentiator 406.

The control functionality provided by the reference adjustment stage 403 is advantageous independent of whether the combiner stage 308 is implemented as an inductor.

The two-fold functionality of the reference adjustment stage 403 can be summarised as follows.

One correlator output is used, by the amplitude adjustment block 404, to control the amplitude of the signal provided to the differentiator and provided as the output of the stage.

The other correlator output is used by the differentiator to provide control of the current through the inductor, to avoid the correction amplifier having to provide current for the inductor.

An exemplary arrangement for the implementation of the second broad embodiment of the invention is now described with reference to FIG. 6.

Figure 6:
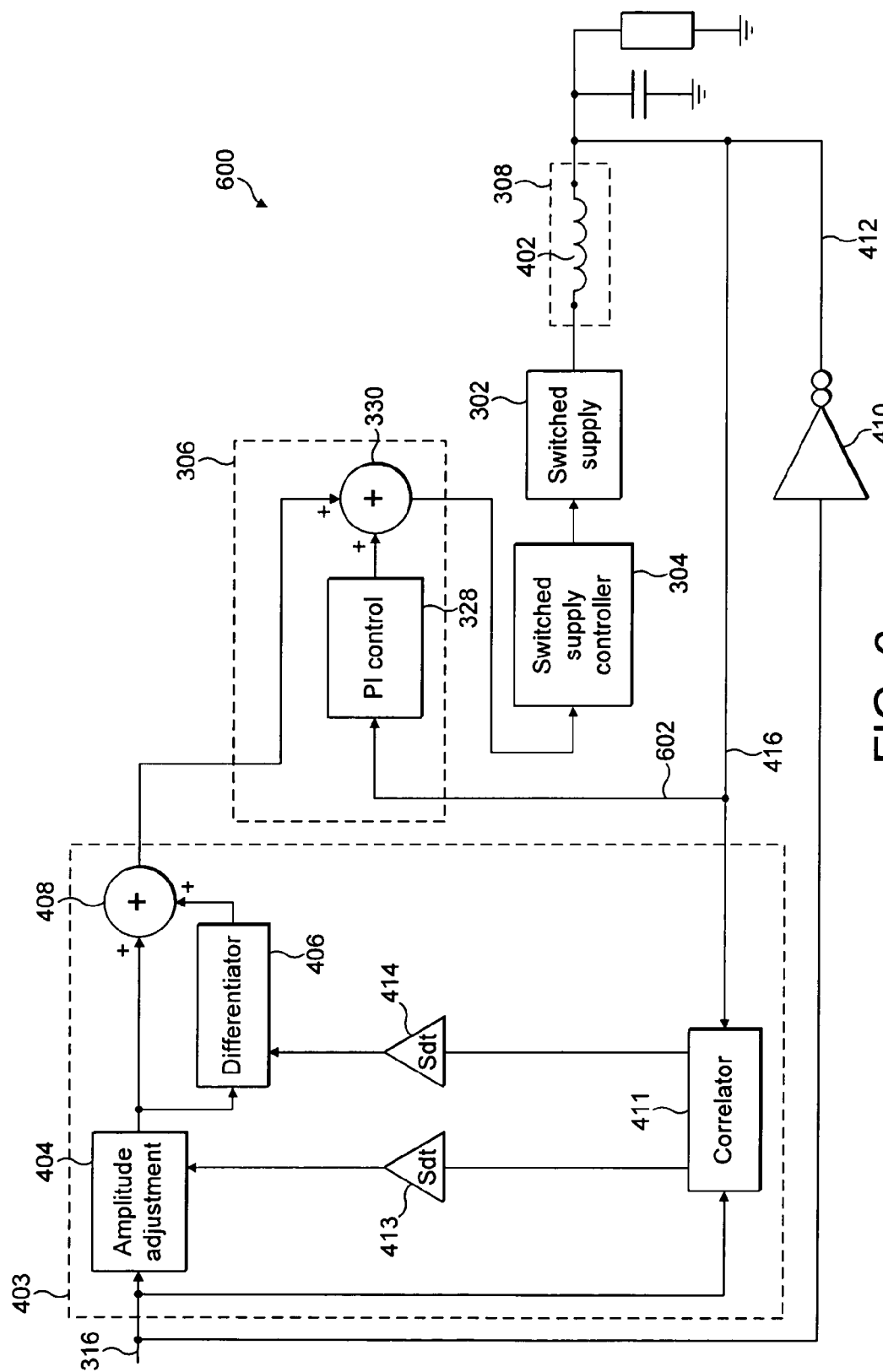
FIG. 6 illustrates an exemplary implementation of a second embodiment of the invention.

With regard to FIG. 6, the arrangement of FIG. 5 is modified such that the feedback to the feedback control stage 306 is provided from the output of the correction amplifier rather than the output of the switched supply stage. Thus, the feedback control stage 306 receives a feedback signal on line 602 which is derived from the output of the correction amplifier on line 412.

In this arrangement, the feedback control stage is modified, as the subtractor 326 is not required. Thus the feedback signal on line 602 forms the input to the PI control block 328, which forms an input to the summer 330. The other input of the summer 330 is provided by the output of the reference adjustment stage 402 as previously.

The arrangement of FIG. 6 illustrates a preferred exemplary arrangement, in which the reference adjustment stage 403 is provided, and the combiner stage 308 is implemented as an inductor. However the principles of providing a feedback signal for the feedback control stage 306 from the output of the correction amplifier is not limited to an arrangement in which the reference adjustment stage 403 is implemented, or in which the combiner stage 308 is implemented as an inductor. The reference adjustment stage 403 may be omitted, and the combiner stage 308 may be implemented by other means such as a transformer.

It should be noted that in various embodiments combinations of features are disclosed, and the invention is not limited in its applicability or implementation to such combinations of features. Thus the broad principle described herein of the provision of a feedback signal from an input to a combining stage is not limited to the specific implementation of the combiner stage. Similarly the implementation of the feedback signal from the input of the combiner stage to the switched supply stage is not limited to the implementation of a reference adjustment stage as illustrated herein.

Similarly advantages may be obtained by implementing the reference adjustment stage described herein in a modulated supply stage, independent of the implementation of the combiner stage. Although the reference adjustment stage has particular advantages when combined with other features described herein, such as when the combiner stage is implemented as an inductor, its usefulness is not limited to such specific implementations.

Still further it should be noted that the implementation of a combiner stage as an inductor is not limited to the specifics of any other aspects shown herein. The implementation of the combiner stage as an inductor is not limited to an arrangement in which a feedback is provided from an input of the combiner to the switched supply stage, although when used in combination with such feature advantages are obtained. Similarly the implementation of the combiner stages and inductor is not limited to any arrangement in which a reference adjustment stage is provided, although again advantages may be obtained by implementing the combiner stage as an inductor in combination with the reference adjustment stage.

Finally it should be noted that the specific implementation of the feedback from an input to the combiner to the switched supply stage is independent of the specific implementation of the combiner stage and is independent of whether or not a reference adjustment stage is provided.

Figure 7:
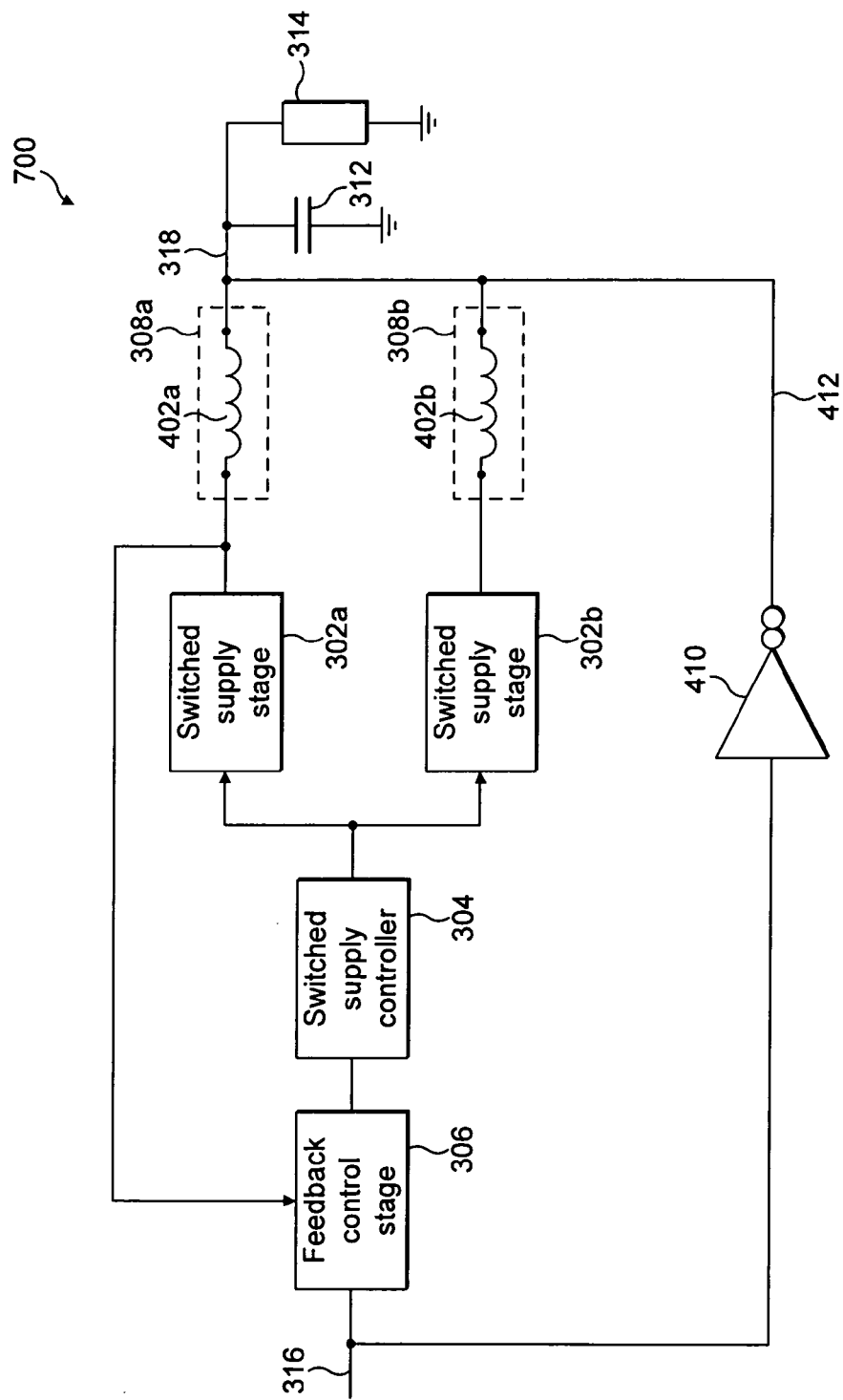
FIG. 7 illustrates an exemplary implementation of embodiments of the invention.

With reference to FIG. 7, there is illustrated a multi-phase, multi-level supply arrangement in accordance with the principles of exemplary embodiments described herein. The arrangement of FIG. 7 utilises the feedback arrangement described in FIG. 3 hereinabove, wherein the feedback to the switched supply stage is provided from the output of the switched supply stage. In addition the arrangement of FIG. 7 utilises the feature of the arrangement of FIG. 4 described hereinabove, where the combiner stage 308 is implemented as an inductor.

In the illustrated multi-phase arrangement of FIG. 7, there is assumed a dual-phase arrangement. Thus there is provided two sets of switched supply stages. Each switched supply stage corresponds to the switched supply stage 302 of earlier figures, and therefore in FIG. 7 there is illustrated a first switched supply stage 302a, and a second switched supply stage 302b, each of which correspond to the switched supply stages 302 of earlier figures. The switched supply controller 304 provides a common switched supply control signal for the two switched supply stages 302a and 302b. As in the arrangement of FIG. 3, the switched supply controller 304 receives an input signal from the feedback control stage 306. The feedback control stage 306 receives the reference signal as an input on line 316, and additionally receives a feedback signal from the output of a switched supply stage. In the example of a multi-phase arrangement, the feedback control stage 306 requires only a single feedback signal from one of the switched supply stages. Thus in the arrangement of FIG. 7 there is illustrated the provision of a feedback signal to the feedback control stage 306 from the output of the switched supply stage 302a.

Each of the switched supply stages 302a and 302b provides an output to a respective combiner stage 308a and 308b. Each of the combiner stages 308a and 308b may be implemented in accordance with any combiner stage previously described herein, in exemplary arrangements. In the preferred arrangement of FIG. 7 the combiner stages 308a and 308b are implemented as inductors, identified as elements 402a and 402b respectively. The first terminal of each of the inductors 402a and 402b receives the output signal from the respective switched supply stage 302a and 302b. The second terminals of the inductors 402a and 402b are connected together to the output line 318.

The correction amplifier 410 receives the reference signal on line 316, and generates a current on line 412 which is injected at the output of the inductors 402a and 402b. Thus the output of the correction amplifier 410 and the outputs of the inductors 402a and 402b are connected in common to the output line, for delivery of output signal to the load.

It will be understood from the foregoing description that each of the combiner stages 308a and 308b may be implemented as transformers. The outputs of the respective transformers may be connected together in order to provide the combined multi-phase signal on line 318.

It will be understood from the foregoing description that the arrangement of FIG. 7 may be modified so as to provide the feedback signal to the feedback control stage from the output of the correction amplifier 410.

It will be apparent from the foregoing description that the arrangement of FIG. 7 may be further modified to include a reference adjustment stage such as reference adjustment stage 403 illustrated in FIGS. 5 and 6.

Each switched supply 302a and 302b may have an array of voltages, e.g. $V_1$ to $V_x$, where x can be any number from 2 upwards that is practicable. The switched supplies 302a and 302b are driven from the switched supply controller 304 which selects the nearest voltage.

In embodiments the switched supply controller 304 could be a PWM, Hysteretic or Delta sigma converter.

In a preferred arrangement the switched supplies 302a and 302b are clocked on opposite phases of a switching clock.

In accordance with the foregoing description there has been presented a number of embodiments for implementing the invention. Various elements of each embodiment may be utilised in isolation or in combination with other described elements. The invention is not limited to in its scope to the specifics of any embodiment described herein. The scope of the invention is defined by the appended claims.

What is claimed is:

1. A voltage supply stage comprising:
    a selection means for selecting one of a plurality of power supply voltages in dependence on a reference signal representing a desired power supply voltage;
    a combining means for combining the selected power supply voltage with a correction signal to generate an adjusted power supply voltage;
    an adjusting means adapted to generate the correction signal in dependence on the reference signal and the adjusted power supply voltage, wherein the selection means is arranged to select the one of the plurality of supply voltages further in dependence on a signal derived from one of the inputs to the combining means; and
    a reference adjustment stage for adjusting the reference signal to provide a modified reference signal, the reference adjustment stage comprising a means for adjusting the amplitude of the reference signal in dependence upon a difference between the amplitude of the reference signal and the amplitude of the selected supply voltage.

2. The voltage supply stage according to claim 1 wherein the signal derived from one of the inputs to the combining means is the output of the selection means.

3. The voltage supply stage according to claim 1 wherein the signal derived from one of the inputs to the combining means is the output of the adjusting means.

4. The voltage supply stage according to claim 1 wherein the selection means is adapted to select in dependence on the modified reference signal.

5. The voltage supply stage according to claim 1 wherein the feedback control means is adapted to provide the signal derive from one of the inputs to the combining means in dependence on the modified reference signal.

6. The voltage supply stage according to claim 1 wherein the means for adjusting the amplitude of the reference signal includes:

a correlator for determining the amplitude error between the reference signal and the selected supply voltage; and an amplitude adjustment block for modifying the reference signal in dependence on said error.

7. A tracking modulated power supply stage for a mobile wireless device including a voltage supply stage according to claim 1.

8. A voltage supply stage comprising:
a selection means for selecting one of a plurality of power supply voltages in dependence on a reference signal representing a desired power supply voltage;
a combining means for combining the selected power supply voltage with a correction signal to generate an adjusted power supply voltage;
an adjusting means adapted to generate the correction signal in dependence on the reference signal and the adjusted power supply voltage, wherein the selection means is arranged to select the one of the plurality of supply voltages further in dependence on a signal derived from one of the inputs to the combining means; and
a feedback control stage for providing the signal, derived from one of the inputs to the combining means, to the selection means, comprising:
a subtractor for subtracting the output of the selection means from the reference signal;
a proportional-integral, PI, controller for receiving the subtracted signal and generating a modified output, and
a summer for adding the modified output of the PI controller to the reference signal, to form the output of the feedback control stage being the adjusted reference signal.

9. The voltage supply stage according to claim 8 in which the combining means comprises an inductor, and the adjustment means comprises a voltage-to-current converter, wherein a current representing the correction signal is injected at the second terminal of the inductor to adjust the current flowing in the inductor provided by the selected power supply voltage, a thus adjusted current flowing in a load connected to the second terminal of the inductor to thereby develop the adjusted supply voltage across said load.

10. A voltage supply stage comprising:
a selection means for selecting one of a plurality of power supply voltages in dependence on a reference signal representing a desired power supply voltage;
a combining means for combining the selected power supply voltage with a correction signal to generate an adjusted power supply voltage;
an adjusting means adapted to generate the correction signal in dependence on the reference signal and the adjusted power supply voltage, wherein the selection means is arranged to select the one of the plurality of supply voltages further in dependence on a signal derived from one of the inputs to the combining means; and
a feedback control stage adapted to receive as a first input the reference signal and for providing the signal, derived from one of the inputs to the combining means, to the selection means, and further adapted to adjust the reference signal in dependence on the one of the inputs to the combining means to provide an adjusted reference signal for the selection means, the feedback control stage comprising:
a proportional-integral, PI, controller for receiving the output of the adjusting means and generating a modified output, and a summer for adding the modified output of the PI controller to the reference signal, to form the output of the feedback control stage being the adjusted reference signal.

11. A voltage supply stage comprising:
a selection means for selecting one of a plurality of power supply voltages in dependence on a reference signal representing a desired power supply voltage;
a combining means for combining the selected power supply voltage with a correction signal to generate an adjusted power supply voltage;
an adjusting means adapted to generate the correction signal in dependence on the reference signal and the adjusted power supply voltage, wherein the selection means is arranged to select the one of the plurality of supply voltages further in dependence on a signal derived from one of the inputs to the combining means; and
a reference adjustment stage for adjusting the reference signal to provide a modified reference signal,
the reference adjustment stage comprising a means for controlling a current flow in the combining means to maximize current flow in the combining means and thereby minimize current flow in the adjustment means.

12. The voltage supply stage according to claim 11 wherein the means for controlling the current flow includes:
a correlator for determining the current flow in the inductor and for providing a control signal to modify coefficients of a differentiator in dependence thereon, the differentiator being arranged to receive the reference signal and generate a differentiated version thereof.

13. The voltage supply stage according to claim 12, wherein the differentiator is arranged to receive as an input the amplitude adjusted reference signal generate a differentiated amplitude adjusted reference signal, the reference adjustment stage further comprising a summer for summing the amplitude adjusted reference signal with the differentiated amplitude adjusted reference signal to form the modified reference signal.

14. A voltage supply stage comprising:
a selection means for selecting one of a plurality of power supply voltages in dependence on a reference signal representing a desired power supply voltage;
a combining means for combining the selected power supply voltage with a correction signal to generate an adjusted power supply voltage;
a correction means adapted to generate the correction signal in dependence on the reference signal and the adjusted power supply voltage;
an adjustment means for adjusting the amplitude of the reference signal in dependence on a difference between the amplitude of the reference signal and the amplitude of the selected supply voltage; and
differentiation means for controlling the current in the combining means to maximize the current flowing in the combining means and thereby minimize the current required to flow in the correction means.

15. A voltage supply stage comprising:
a controller for selecting one of a plurality of power supply voltages in dependence on a reference signal representing a desired power supply voltage;
a combiner for combining the selected power supply voltage with a correction signal to generate an adjusted power supply voltage; and
a correction stage adapted to generate the correction signal in dependence on the reference signal and the adjusted power supply voltage, wherein the controller is arranged to select the one of the plurality of supply voltages further in dependence on a signal derived from one of the inputs to the combiner; and a feedback control stage for providing the signal, derived from one of the inputs to the combiner, to the controller, comprising:

a subtractor for subtracting the output of the controller from the reference signal;

a proportional-integral, PI, controller for receiving the subtracted signal and generating a modified output, and a summer for adding the modified output of the PI controller to the reference signal, to form the output of the feedback control stage being the adjusted reference signal.

16. The voltage supply stage according to claim 15 in which the combiner comprises an inductor, and the correction stage comprises a voltage-to-current converter, wherein a current representing the correction signal is injected at the second terminal of the inductor to adjust the current flowing in the inductor provided by the selected power supply voltage, a thus adjusted current flowing in a load connected to the second terminal of the inductor to thereby develop the adjusted supply voltage across said load.

17. A voltage supply stage comprising:

a controller for selecting one of a plurality of power supply voltages in dependence on a reference signal representing a desired power supply voltage;

a combiner for combining the selected power supply voltage with a correction signal to generate an adjusted power supply voltage; and a correction stage adapted to generate the correction signal in dependence on the reference signal and the adjusted power supply voltage, wherein the controller is arranged to select the one of the plurality of supply voltages further in dependence on a signal derived from one of the inputs to the combiner; and a feedback control stage adapted to receive as a first input the reference signal and for providing the signal, derived from one of the inputs to the combiner, to the controller, and further adapted to adjust the reference signal in dependence on the one of the inputs to the combiner to provide an adjusted reference signal for the controller, the feedback control stage comprising:

a proportional-integral, PI, controller for receiving the output of the correction stage and generating a modified output, and a summer for adding the modified output of the PI controller to the reference signal, to form the output of the feedback control stage being the adjusted reference signal.

18. A voltage supply stage comprising:

a controller for selecting one of a plurality of power supply voltages in dependence on a reference signal representing a desired power supply voltage;

a combiner for combining the selected power supply voltage with a correction signal to generate an adjusted power supply voltage; and a correction stage adapted to generate the correction signal in dependence on the reference signal and the adjusted power supply voltage, wherein the controller is arranged to select the one of the plurality of supply voltages further in dependence on a signal derived from one of the inputs to the combiner; and a reference adjustment stage for adjusting the reference signal to provide a modified reference signal, the reference adjustment stage comprising a an amplitude adjustment stage for adjusting the amplitude of the reference signal in dependence upon a difference between the amplitude of the reference signal and the amplitude of the selected supply voltage.

19. The voltage supply stage according to claim 18 wherein the controller is adapted to select in dependence on the modified reference signal.

20. The voltage supply stage according to claim 18 wherein the controller is adapted to provide the signal derived from one of the inputs to the combiner in dependence on the modified reference signal.

21. The voltage supply stage according to claim 18 wherein the signal derived from one of the inputs to the combiner is the output of the controller.

22. The voltage supply stage according to claim 18 wherein the signal derived from one of the inputs to the combiner is the output of the correction stage.

23. The voltage supply stage according to claim 18 wherein the amplitude adjustment stage includes:

a correlator for determining the amplitude error between the reference signal and the selected supply voltage; and an amplitude adjustment block for modifying the reference signal in dependence on said error.

24. A tracking modulated power supply stage for a mobile wireless device including a voltage supply stage according to claim 18.

25. A voltage supply stage comprising:

a controller for selecting one of a plurality of power supply voltages in dependence on a reference signal representing a desired power supply voltage;

a combiner for combining the selected power supply voltage with a correction signal to generate an adjusted power supply voltage; and a correction stage adapted to generate the correction signal in dependence on the reference signal and the adjusted power supply voltage, wherein the controller is arranged to select the one of the plurality of supply voltages further in dependence on a signal derived from one of the inputs to the combiner; and a reference adjustment stage for adjusting the reference signal to provide a modified reference signal, the reference adjustment stage adapted to control a current flow in the combiner to maximize current flow in the combiner and thereby minimize current flow in the correction stage.

26. The voltage supply stage according to claim 25 wherein the reference adjustment stage is adapted to include a correlator for determining the current flow in the inductor and for providing a control signal to modify coefficients of a differentiator in dependence thereon, the differentiator being arranged to receive the reference signal and generate a differentiated version thereof.

27. The voltage supply stage according to claim 26, wherein the differentiator is arranged to receive as an input the amplitude adjusted reference signal generate a differentiated amplitude adjusted reference signal, the reference adjustment stage further comprising a summer for summing the amplitude adjusted reference signal with the differentiated amplitude adjusted reference signal to form the modified reference signal.

28. The method according to claim 25 wherein controlling the current flow includes determining, by correlation, the current flow in the inductor and modifying coefficients of a differentiator in dependence thereon, the differentiator being arranged to receive the reference signal and generate a differentiated version thereof.

29. The method according to claim 28, wherein the differentiator is arranged to receive as an input the amplitude adjusted reference signal and generate a differentiated amplitude adjusted reference signal, further comprising summing the amplitude adjusted reference signal with the differentiated amplitude adjusted reference signal to form the modified reference signal.

30. A voltage supply stage comprising:
a controller for selecting one of a plurality of power supply voltages in dependence on a reference signal representing a desired power supply voltage;
a combiner for combining the selected power supply voltage with a correction signal to generate an adjusted power supply voltage;
a correction stage adapted to generate the correction signal in dependence on the reference signal and the adjusted power supply voltage;
an amplitude adjustment stage for adjusting the amplitude of the reference signal in dependence on a difference between the amplitude of the reference signal and the amplitude of the selected supply voltage; and
a stage for controlling the current in the combiner to maximize the current flowing in the combiner and thereby minimize the current required to flow in the correction stage.

31. A method for a voltage supply stage comprising:
selecting one of a plurality of power supply voltages in dependence on a reference signal representing a desired power supply voltage;
combining the selected power supply voltage with a correction signal to generate an adjusted power supply voltage; and
generating the correction signal in dependence on the reference signal and the adjusted power supply voltage, wherein the selecting step is arranged to select the one of the plurality of supply voltages further in dependence on a signal derived from one of the inputs in the combining step; and
providing the signal, derived from one of the inputs in the combining step, for the selection step, by:
subtracting the output of the selecting step from the reference signal;
receiving, a proportional-interval, PI, controller, the subtracted signal and generating a modified output, and
adding the modified output of the PI controller to the reference signal, to form the output of the feedback control stage being the adjusted reference signal.

32. The method according to claim 31 further comprising injecting a current representing the correction signal at a terminal of an inductor to adjust the current flowing in the inductor provided by the selected power supply voltage, a thus adjusted current flowing in a load connected to the terminal of the inductor to thereby develop the adjusted supply voltage across said load.

33. A method for voltage supply stage comprising:
selecting one of a plurality of power supply voltages in dependence on a reference signal representing a desired power supply voltage;
combining the selected power supply voltage with a correction signal to generate an adjusted power supply voltage; and
generating the correction signal in dependence on the reference signal and the adjusted power supply voltage, wherein the selection step selects the one of the plurality of supply voltages further in dependence on a signal derived from one of the inputs in the combining step; and
receiving as a first input the reference signal and for providing the signal, derived from one of the inputs in the combining step, to the selection step, the method further adapted to adjust the reference signal in dependence on the one of the inputs in the combining step to provide an adjusted reference signal for the selection step, the method further comprising receiving, at a proportional-integral, PI, controller, the reference signal and generating a modified output, and adding the modified output of the PI controller to the reference signal, to form the adjusted reference signal.

34. A method for a voltage supply stage comprising:
selecting one of a plurality of power supply voltages in dependence on a reference signal representing a desired power supply voltage;
combining the selected power supply voltage with a correction signal to generate an adjusted power supply voltage; and
generating the correction signal in dependence on the reference signal and the adjusted power supply voltage, wherein the selection step is arranged to select the one of the plurality of supply voltages further in dependence on a signal derived from one of the inputs of the combining step; and
adjusting the reference signal to provide a modified reference signal, the adjusting step comprising adjusting the amplitude of the reference signal in dependence upon a difference between the amplitude of the reference signal and the amplitude of the selected supply voltage.

35. The method according to claim 34 comprises selecting in dependence on the modified reference signal.

36. The method according to claim 34 comprises providing the signal derived from one of the inputs to the combining step in dependence on the modified reference signal.

37. The method according to claim 34 wherein the signal derived from one of the inputs to the combining step is the output of the selecting step.

38. The method according to claim 34 wherein the signal derived from one of the inputs to the combining step is the output of the adjusting step.

39. The method according to claim 34 wherein adjusting the amplitude of the reference signal includes:
determining by correlation the amplitude error between the reference signal and the selected supply voltage; and
modifying the reference signal in dependence on said error.

40. A method for a tracking modulated power supply stage for a mobile wireless device including a method for a voltage supply stage according to claim 34.

41. A method for a voltage supply stage comprising:
selecting one of a plurality of power supply voltages in dependence on a reference signal representing a desired power supply voltage;
combining the selected power supply voltage with a correction signal to generate an adjusted power supply voltage; and
generating the correction signal in dependence on the reference signal and the adjusted power supply voltage, wherein the selecting step is arranged to select the one of the plurality of supply voltages further in dependence on a signal derived from one of the inputs of the combining step; and
adjusting the reference signal to provide a modified reference signal, the adjusting step comprising controlling a current flow in the combining step to maximize current flow in the combining step and thereby minimize current flow in the adjusting step.

42. A method for a voltage supply stage comprising:
- selecting one of a plurality of power supply voltages in dependence on a reference signal representing a desired power supply voltage;
- combining the selected power supply voltage with a correction signal to generate an adjusted power supply voltage;
- generating the correction signal in dependence on the reference signal and the adjusted power supply voltage;
- adjusting the amplitude of the reference signal in dependence on a difference between the amplitude of the reference signal and the amplitude of the selected supply voltage; and
- controlling the current flow to maximize the current flowing during combining to thereby minimize the current required to flow to generate the correction signal.

\* \* \* \* \*

UNITED STATES PATENT AND TRADEMARK OFFICE
CERTIFICATE OF CORRECTION

PATENT NO. : 8,680,833 B2
APPLICATION NO. : 12/991695
DATED : March 25, 2014
INVENTOR(S) : Martin Paul Wilson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 567 days.

Signed and Sealed this

Twenty-ninth Day of September, 2015

Michelle K. Lee
*Director of the United States Patent and Trademark Office*